United States Patent

Hogan et al.

Patent Number: 5,336,320
Date of Patent: Aug. 9, 1994

[54] FAST RESPONSE FILM COATER

[75] Inventors: Patrick T. Hogan, Lorain; James J. Turner, Amherst, both of Ohio

[73] Assignee: Nordson Corporation, Westlake, Ohio

[21] Appl. No.: 906,696

[22] Filed: Jun. 30, 1992

[51] Int. Cl.$^5$ ............................................. B05C 5/00
[52] U.S. Cl. ............................... 118/300; 222/336; 239/124; 239/584; 267/162; 417/385
[58] Field of Search ............... 118/300, 312, DIG. 2, 118/688, 325; 427/96, 421; 222/336, 526; 267/162; 425/7; 239/127, 584, 124, 126; 417/385, 388

[56] References Cited

U.S. PATENT DOCUMENTS

| | | | |
|---|---|---|---|
| 2,779,627 | 1/1957 | Gray | 239/126 |
| 2,893,026 | 7/1959 | Sillars et al. | 118/300 |
| 3,394,631 | 7/1968 | Thompson | 267/162 |
| 3,702,107 | 11/1972 | Rood et al. | 118/317 |
| 3,816,165 | 6/1974 | Horvath et al. | 118/306 |
| 3,921,570 | 11/1975 | Hogstrom et al. | 118/317 |
| 3,940,072 | 2/1976 | Ishikawa et al. | 239/527 |
| 4,022,381 | 5/1977 | Karliner | 239/126 |
| 4,180,011 | 12/1979 | Halicki | 118/685 |
| 4,337,281 | 6/1982 | Boone | 427/236 |
| 4,396,529 | 8/1983 | Price et al. | 118/300 |
| 4,687,137 | 8/1987 | Boger et al. | 239/124 |
| 4,753,819 | 6/1988 | Shimada | 427/96 |
| 4,785,996 | 11/1988 | Ziecker et al. | 425/7 |
| 4,809,885 | 3/1989 | Hayashi et al. | 118/305 |
| 4,872,417 | 10/1989 | Kuwabara et al. | 118/313 |
| 4,880,663 | 11/1989 | Shimada | 427/96 |
| 4,886,013 | 12/1989 | Turner et al. | 118/668 |
| 4,957,783 | 9/1990 | Gabryszewski | 118/300 |
| 4,987,854 | 1/1991 | Hall | 118/300 |
| 5,141,165 | 8/1992 | Sharpless et al. | 239/752 |

FOREIGN PATENT DOCUMENTS

| | | | |
|---|---|---|---|
| 2511566 | 9/1976 | Fed. Rep. of Germany | 239/584 |
| 284818 | 11/1990 | Fed. Rep. of Germany | 239/584 |
| 2171222A | 8/1986 | United Kingdom | 118/326 |

OTHER PUBLICATIONS

Pertinent pages from a Key Bellevilles, Inc. catalog entitled "Precision (Belleville) Disc Springs" date unknown.

Primary Examiner—Joseph W. Drodge
Attorney, Agent, or Firm—Wood, Herron & Evans

[57] ABSTRACT

A film coater for applying a coating material to selected areas on a target substrate, such as a printed circuit board, having a vented dispenser body with a plunger moveable therein between an open and closed position. A flow of pressurized air which moves the plunger to the open position is controlled by a valve carried by the dispenser body, and a plurality of springs return the plunger to the closed position. The number of return springs is selected to provide a variable biasing force so that movement of the plunger is controlled to eliminate or at least significantly reduce hammering, tapering and drooling, particularly when the dispenser is operated intermittently.

9 Claims, 1 Drawing Sheet

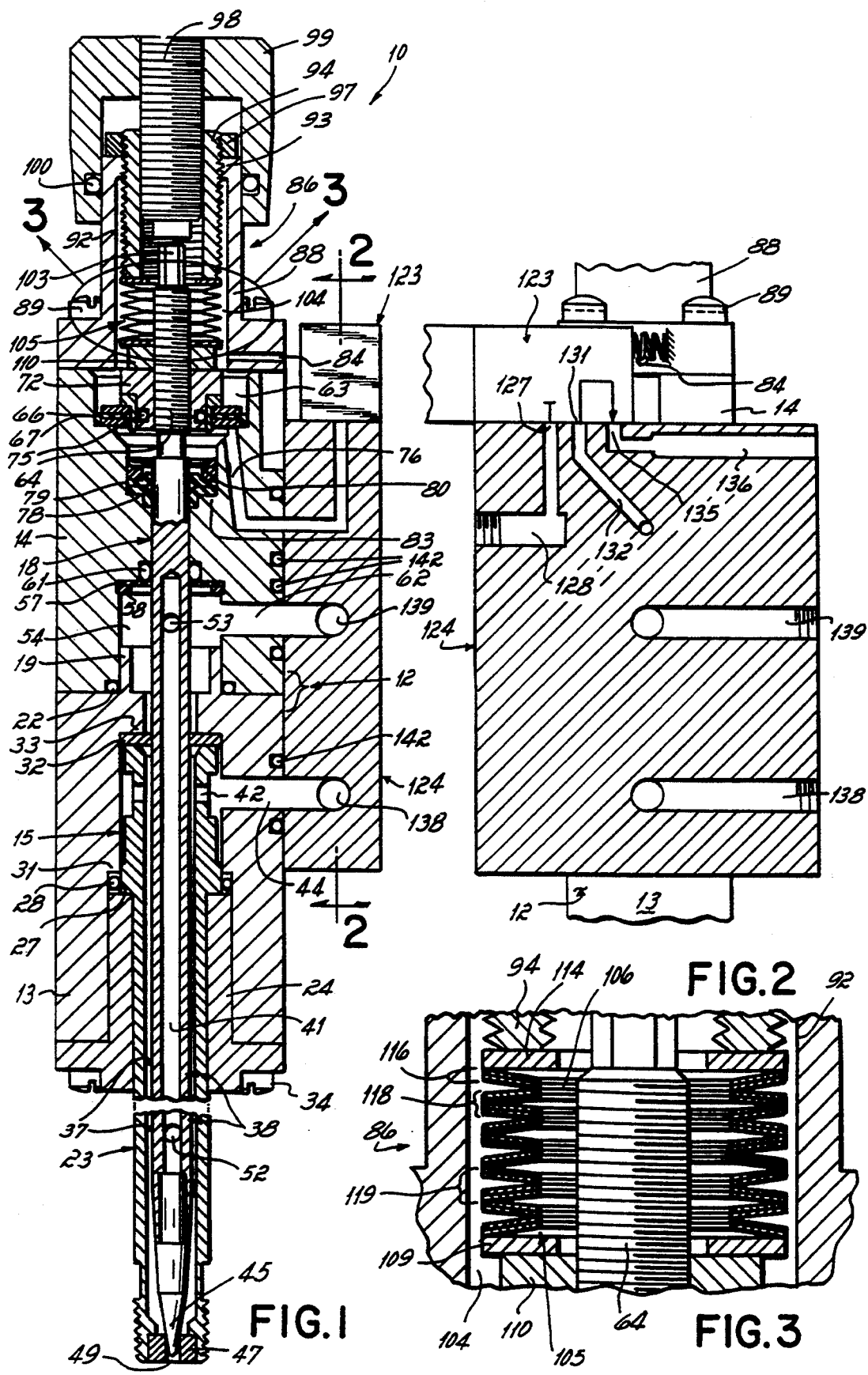

FAST RESPONSE FILM COATER

FIELD OF THE INVENTION

This invention relates to film coaters and, more particularly, to a fast response film coater for applying a coating material to selected areas on a substrate, such as a printed circuit board.

BACKGROUND OF THE INVENTION

Packaged circuit boards for electronic instruments are typically coated by a moisture-proof, liquid insulating film to protect the circuit boards from moisture, electric leakage and dust. Preferably, the moisture-proof insulator films are what are known as conformal coatings, such as acrylic, polyurethane or epoxy synthetic resins dissolved in a volatile solvent. When applied to a clean printed circuit board, a uniform thickness insulative resin film is formed as the solvent evaporates on a continuous basis.

One method of applying coatings of moisture-proof insulators to printed circuit boards in mass production processes has been the spray method, in which the moisture-proof insulator is applied to the printed circuit board by spraying techniques such as disclosed in U.S. Pat. Nos. 4,753,819 and 4,880,663, both to Shimada, which are owned by the assignee of this invention. Various film coaters or dispensing apparatus have been employed for this purpose, which typically include a plunger to open and close a discharge outlet through which the coating material is emitted and then applied onto the circuit board or other substrate. The plunger in such dispensers is usually moved to an open position with pressurized air acting on a piston carried by the plunger, and returned to the closed position by a return spring. A flow control mechanism, such as a computer controlled solenoid valve, is used to control the flow of pressurized air from a source to the dispenser. Conventionally, the valve is separated from the dispenser by as much as 6 feet or more of air line.

When coating printed circuit boards, it is often desirable to only coat selected areas of the board. One method involves moving the dispenser to the selected area, opening the discharge outlet when it is over the selected area, effecting relative movement between the discharge outlet of the dispenser and the circuit board in order to coat the selected area, closing the discharge outlet, and repeating this process for each area to be coated. Various problems have been encountered in previous attempts to selectively coat in this manner.

One problem has been the response time of the dispenser, i.e., the time it takes for coating material to begin or stop coating the target substrate after a computer or other controller has signaled the valve mechanism associated with the source of pressurized air to open the plunger of the dispenser or allow it to close. Previous dispensers had response times that were only fast enough to coat relatively large selected areas without having to mask the parts of the circuit board to be left uncoated. Attempts to coat smaller areas of printed circuit boards have generally required additional programming of the computer control, slowed down production, and/or resulted in less control of the sharpness of the boundaries of the coating pattern produced and the repeatability of the pattern from board to board.

Other problems plaguing such dispensers, independent of the slow response time, involve distortions of the coating pattern which are often referred to as "hammering", "tapering" and "drooling". Hammering is typically evidenced by a broadening of the coating pattern beyond the desired pattern area when the discharge outlet of the dispenser is opened and/or closed. Tapering is displayed as a narrowing of the coating pattern when the discharge outlet is opened. Drooling is evidenced by a tail of the coating material being deposited on the substrate outside the pattern area when the discharge outlet is closed.

SUMMARY OF THE INVENTION

It is therefore among the objectives of this invention to provide a dispenser with a faster response time than previously obtainable, thereby enabling smaller areas on a target substrate to be selectively coated.

Another objective of this invention is to provide a dispenser which is less likely to produce hammering, tapering or drooling. Whether hammering, tapering or drooling occurs for any given dispenser or spraying method can be influenced by many factors. However, it has been discovered that the speed at which the plunger is actuated to open or close the discharge outlet appears to be the most dominant factor. If the plunger moves too fast, hammering occurs. If it moves too slowly, tapering and/or drooling occurs. Therefore, an additional objective of this invention is to provide a dispenser with a mechanism for controlling the speed at which the plunger is actuated to open and close the discharge outlet, in order to eliminate or at least reduce hammering, tapering and drooling.

While hammering, tapering and drooling are dependent upon how fast the plunger is opened or closed, the optimum speed of the plunger is dependent on a number of factors. As will be discussed in greater detail below, the coating material used, and more particularly its fluid viscosity, plays a major role in determining the preferred or optimum plunger speed.

Because various coating materials are often used with the same dispenser, it is a further objective of this invention is to provide a dispenser which permits the speed of the plunger to be easily and quickly adjusted or tuned while still reducing or eliminating hammering, tapering and drooling.

These objectives are accomplished in a dispensing apparatus including a dispenser body formed with a fluid bore having an inlet for receiving coating material and a discharge outlet. A plunger is movable within the fluid bore between an open position and a closed position relative to the discharge outlet, and this plunger carries a piston in position within an air cavity formed in the dispenser body. A valve, preferably carried by the dispenser body, is used to control the flow of pressurized air into the air cavity and against the piston to move the plunger to the open position. A return spring or other plunger return mechanism is used to return the plunger to the closed position.

In the present invention, the opening and closing of the discharge outlet is controlled by the movement of the plunger. The plunger return mechanism provides a positive force for maintaining the plunger in the closed position. The pressurized air must exert a sufficient force to overcome this positive closing force before the plunger will move to the open position. From the opened condition, the discharge outlet is closed by venting or exhausting pressurized air out of the air cavity, thus dropping the air pressure, until the closing force exerted by the plunger return mechanism is sufficient to move the plunger to the closed position.

Reducing the response time permits smaller areas on a printed circuit board or other substrate to be coated or skipped. It has been discovered that the response time, to a significant extent, is a function of the rate at which the air pressure against the piston in the air cavity rises and exhausts, and to a lesser extent, how fast the valve opens and closes. Because the valve or other air flow control mechanism is carried by the dispenser body of this invention, rather than being located remote from the dispenser at the end of a long air supply line as in other designs, the volume of air between the piston and the valve is comparatively small. With a smaller volume of air to be pressurized or vented, the reaction time between activation of the valve and pressurizing or venting of the air cavity is reduced, thus reducing the response time. With respect to plunger speed, the response time decreases as the speed of the plunger in moving to the open and closed position increases.

While reducing response time is an important aspect of applying a sharply defined, intermittent pattern of coating material on a circuit board, as previously noted, the speed of the plunger controls whether hammering, tapering or drooling occur. One aspect of this invention is therefore predicated on the concept of obtaining controlled movement of the plunger between an open and closed position, i.e., rapid enough to produce the desired intermittent pattern without tapering or drooling but not so fast as to create hammering. The plunger speed has been found to be a function of the rate at which the air pressure against the piston in the air cavity rises and exhausts, and the closing force exerted by the plunger return mechanism, e.g., the spring rate where the plunger return mechanism comprises one or more springs. Generally, if the rate at which the air pressure against the piston in the air cavity rises and exhausts is increased, with the spring rate remaining constant, the speed of the plunger will increase. An increase in plunger speed was therefore obtained by moving the valve proximate to the dispenser body as described above. In many instances, such an increase in plunger speed was found to be too extreme, resulting in unwanted hammering or broadening of the coating pattern. Experiments were therefore conducted to obtain more controlled plunger movement, and it was discovered that the speed of the plunger could be reduced, and hammering at least significantly curtailed, by increasing the spring rate to a level in the range of about 150-300 lbs. per inch from a typical spring rate of 50 pounds per inch found in other dispensers. Accordingly, by moving the valve proximate to the dispenser body and increasing the spring rate, an optimum response time and plunger speed is obtained with the dispenser of this invention which provides the desired intermittent pattern, while at the same time avoiding hammering, tapering or drooling.

In another aspect of this invention, it is recognized that the same dispenser is often used with a variety of coating materials. It has been found that hammering, tapering and/or drooling are dependent upon the type of coating material being used, and especially the fluid viscosity of such materials. The coating material is pressurized to control its flow rate through the dispenser and out the discharge outlet. It has been found that in order to apply the desired "leaf-shaped" pattern to a circuit board through an airless nozzle as disclosed in the Shimada Pat. Nos. 4,753,819 and 4,880,663, which have incorporated by reference in their entirety herein, higher viscosity coating material must be transmitted through the dispenser to its discharge outlet at a faster velocity and flow rate than lower viscosity coating material This requires a commensurate change in plunger speed to avoid hammering, tapering or drooling. As noted above, plunger speed can be easily and reliably controlled by varying the spring rate of the return spring. While a single spring can be used, with the spring being replaced when a different spring rate is needed, it is preferable to use multiple springs in order to more easily and conveniently control the change in spring rate and, thus, the change in plunger speed. Therefore, in a preferred embodiment, the plunger return mechanism is designed to accommodate varying numbers of disc springs, stacked on top of one another, so that the resultant spring rate and, thus, the plunger speed, can be varied by simply adding or removing springs to accommodate a particular type of coating material.

DESCRIPTION OF THE DRAWINGS

The structure, operation and advantages of the presently preferred embodiment of this invention will become further apparent upon consideration of the following description taken in conjunction with the accompanying drawings, wherein:

FIG. 1 is a side view of a coating material dispenser according to the present invention, in partial cross section;

FIG. 2 is a side view taken along lines 2—2 of FIG. 1 including a diagrammatic representation of the flow control mechanism for controlling the flow of pressurized air; and FIG. 3 is an enlarged view of the encircled area 3—3 of FIG. 1.

DETAILED DESCRIPTION OF THE INVENTION

Referring now to FIG. 1, a dispenser 10 is illustrated which includes a dispenser body 12 having a lower module 13 mounted to an upper module 14. Each module 13 and 14 has a stepped bore 15 and 18, respectively. The lower module 13 has an annular upper portion 19 carried within the lower end of the stepped bore 18 of upper module 14 which is sealed thereto by an O-ring 22. A sleeve 24 is carried within the lower portion of bore 15 and is secured to the lower module 13 with bolts 34. The sleeve is formed with a throughbore which receives a cylindrical extension 23 having an annular boss 27 formed intermediate along its length. The annular boss 27 of cylindrical extension 23 rests atop the sleeve 24 and engages an O-ring 28 at the upper end of the sleeve 24 and is captured thereat between the sleeve 24 and an annular shoulder 31 intermediate along bore 15. The upper end of cylindrical extension 23 engages and captures a flat washer 32 against another annular shoulder 33 on the upper end of bore 15.

The cylindrical extension 23 has an internal passageway or fluid bore 37 formed therethrough which receives a movable plunger 38 having a hollow interior 41. A space is formed between the outside of plunger 38 and the fluid bore 37 which is connected by a passage 42 formed in an upper portion of the extension 23 to a fluid inlet port 44 in the lower module 13. Coating material is introduced from a source (not shown) through a manifold 124, described in detail below, into the port 44. From the port 44, the coating material enters the passage 42 and flows into the fluid bore 37 of extension 23 and along the outside of plunger 38.

The plunger 38 extends downwardly to the bottom end of the extension 23. Preferably, the lower end 45 of the plunger 38 is tapered and formed to engage a seat 47 located at the bottom end of the extension 23. The plunger 38 is movable between an open, retracted position in which its lower end 45 disengages the seat 47 and uncovers a discharge outlet 49 formed therein, and a closed, extended position (as shown in FIG. 1) in which the lower end 45 of plunger 38 engages seat 47 and blocks the discharge outlet 49. This movement of the plunger 38 controls the flow of coating material discharged from the extension 23 for deposition onto a substrate as described below.

The coating material flows around the outside of the plunger 38 to its lower end 45 where it is ejected through the discharge outlet 49 if the plunger 38 is in the retracted, open position. In the event the plunger 38 is in the closed position, and/or in order to remove excess coating material from the extension 23, provision is made to recirculate the coating material from the bottom of the extension 23 upwardly and out of the dispenser body 12.

The plunger 38 is formed with a port 52 at a point immediately above its lower, tapered end 45. Excess or unused coating material which is not ejected through the discharge outlet 49 enters the port 52 of the plunger 38 and flows upwardly within its hollow interior 41 to a second port 53 formed at the upper end of the plunger 38. The coating material exits the port 53 and enters a cavity 54 partially formed in the lower end of the upper module 14 and the upper end of the lower module 13 between the washer 32 which forms a seal at the lower end of the cavity 54 and a spring loaded U-cup 61 which forms a seal at the upper end of the cavity 54. The seal 61 is held in place by a retaining ring 58 and a washer 57 positioned below it. This cavity 54 is connected to a recirculation outlet port 62 formed in the upper module 14 which communicates with the source of coating material (not shown) through manifold 124 described below. It is contemplated that coating material will be continuously recirculated within the plunger 38 even when a portion of the coating material is ejected through discharge outlet 49. This insures that the coating material remains at the appropriate pressure and temperature throughout the operation of dispenser 10.

An upper length of the stepped bore 18 of the upper module 14 forms an air cavity 63. The air cavity 63 receives a threaded upper portion 64 of the plunger 38 which is threadably mounted to an air piston 66 by a lock nut 72. The lock nut 72 is threadably received at the lower end of the threaded portion 64 of the plunger 38. The air piston 66 is sealed to the lock nut 72 by an O-ring 75 which is captured therebetween. The air piston 66 is slidable within the air cavity 63 and includes a circumferential seal 67 which provides an air tight seal along the wall of the air cavity 63.

The portion of the air cavity 63 below the air piston 66 is connected to a source of pressurized air (not shown) through an air transfer bore 76 formed in the upper module 14 and a connecting bore 132 in the manifold 124, as described below. As discussed below, the pressurized air applies a force against the piston 66 to move the plunger 38 to the open position. The base of the air cavity 63 is sealed to the plunger 38 by a pair of formed hat seals 78 which are held in place by a backup seal 79 and a retaining ring 80, located above the seals 78 and 79, and an annular shoulder 83 in the bore 18 of the upper module 14. A vent 84 formed through the upper module 14 connects the upper portion of the air cavity 63 above the air piston 66 to atmosphere. The vent 84 permits air to enter and exit this upper portion when the piston 66 is actuated as described below.

A plunger return mechanism 86 is used for returning the plunger 38 to the closed or engaged position. This mechanism 86 includes a collar 88 mounted to the upper end of the upper module 14, such as by bolts 89, formed with a throughbore defining an inner wall 92 having a threaded portion 93 at its upper end. The collar 88 receives a hollow plug 94 having external threads which mate with the threaded portion 93 of the inner wall 92. A lock nut 97 is threaded onto the plug 94 into engagement with the top edge of the collar 88. The plug 94 is hollow along its length with internal threads which mate with external threads on a plunger stop 98 mounted to a microadjustment cap 99. The microadjustment cap 99 extends over the top edge of the collar 88 telescopically and an O-ring 100 is disposed therebetween. Rotation of the cap 99 results in the lower end of the plunger stop 98 moving relative to an upper, stop end 103 of the plunger 38. The O-ring 100 functions as a friction device to maintain the adjustment of the cap 99.

Referring to FIG. 3, a portion of the inner wall 92 of the collar 88 forms a spring cavity 104 which receives an upper portion of the plunger 38, including an upper length of the threaded portion 64, with a plurality of springs 105 mounted therein. Each spring 105 is preferably a disc spring, like those manufactured by Key Bellvilles, Inc., with a hole 106 formed therein for allowing the threaded portion 64 of the plunger 38 to freely pass therethrough. The springs 105 are stacked one on top of the other, as will be discussed in detail hereafter, with the lowest spring engaging and capturing a lower flat washer 109 against a hex nut 110 threaded intermediate onto the threaded portion 64 of plunger 38. The uppermost of the springs 105 engages and captures an upper flat washer 114 against the lower end of the plug 94.

The springs 105 supply a force for returning the plunger 38 to the closed position. These springs 105 are typically preloaded to at least 4–5 pounds, and preferably 12 pounds, by rotating the hollow plug 94 and moving it downward. The preload prevents coating material from leaking out of the discharge outlet when the plunger 38 is in the closed position. The 4–5 pounds of preload is generally sufficient to prevent leaking when the coating material is pressurized within the range of about 15–60 psi, but a preload of 12 pounds tends to produce a coating pattern having sharper or better defined edges.

The number and manner in which the springs 105 are stacked one on top of the other will determine the spring rate and therefore the spring force exerted by the springs. It should be noted that the spring rate is also affected by the preload. As the preload increases the spring rate decreases. In the presently preferred embodiment, parallel pairs 116 of the springs 105 are stacked in series. Each disc spring 105 is generally bowl-shaped. A "parallel" pair 116 of springs 105 is obtained by stacking one spring 105 on top of another spring 105 with the convex side of one spring contacting the concave side of the other spring. The "parallel" pairs 116 are stacked one on top of the other in "series", that is with their concave sides facing each other (designated as 118) and their convex sides facing each other (designated as 119).

A wide range of spring rates can be easily attained by adding or subtracting these parallel pairs 116. Access to the springs 105 is preferably accomplished by removing the bolts 89 and then the collar 88. By using disc springs and stacking them in this manner, a high spring rate is attainable in a relatively small package compared to the same spring rate obtained by using coil compression springs. One disc spring 105 presently being used, manufactured by Key Bellvilles, Inc., Part No. R-3, has an outside diameter of about 0.492 inches, a thickness of about 0.010 inches and an overall height of about 0.020 inches. Twelve parallel pairs 116 of these disc springs 105 stacked in series will have a spring rate of about 150 pounds per inch, ten stacked parallel pairs will have a spring rate of about 225 pounds per inch and eight stacked parallel pairs will have a spring rate of 300 pounds per inch.

Referring to FIGS. 1 and 2, an air flow control mechanism 123, preferably a three-way solenoid valve, is mounted on the manifold 124 carried by both modules 13 and 14 of the dispenser body 12. An inlet 127 to the valve 123 communicates with a source of pressurized air (not shown) through an inlet air bore 128 formed in the manifold 124. A two-way outlet port 131 to the valve 123 communicates with the air cavity 63 by a connecting bore 132 formed through the manifold 124 and connected with the transfer bore 76. An exhaust outlet 135 from the valve 123 is connected to the atmosphere by a stepped exhaust bore 136 formed through the manifold 124. The valve 123 has a closed position in which the inlet 127 is closed, cutting off the flow of pressurized air into the valve 123, an open position in which the inlet 127 and two-way port 131 are open allowing pressurized air to flow into the inlet 127, through the valve 123 and out the port 131, and an exhaust position in which the inlet 127 is closed and the two-way port 131 and the exhaust outlet 135 are open to form a passageway between the air cavity and the atmosphere. While a three-way solenoid valve is preferred, a four-way solenoid valve, manufactured by Honeywell, Inc., Skinner Division, Series K4M valve, Part No. K4M02-01, was used because it performed better than any three-way valve presently known. In order to use this four-way valve in this application, one of its two outlet ports must be blocked off.

A fluid inlet bore 138 and a fluid recirculation bore 139 formed in the manifold 124, connect a source of coating material to the fluid inlet port 44 and the recirculation port 62, respectively. The manifold 124 is sealed to the dispenser body 12 around each of its bores 128, 138 and 139 by an O-ring 142 seated in an annular groove formed in the dispenser body 12 around each port 44 and 62 and the transfer bore 76.

Method of Operation

The operation of the dispenser 10 of this invention is as follows. Pressurized coating material is introduced into the fluid inlet port 44 of the dispenser body 12 through the fluid inlet bore 138 in the manifold 124. Coating material flows from the fluid inlet port 44 through the passage 42 and into the fluid bore 37. With the springs 105 being preloaded and the tapered end 45 of the plunger 38 engaged with the seat 47 formed at the bottom of the fluid bore 37, as illustrated in FIG. 1, the coating material is not permitted to flow through the discharge outlet 49 formed by the seat 47. In the preferred embodiment, the coating material subsequently recirculates through the lower port 52 and the upper port 53, out of the dispenser body 12 through the recirculation port 62, into the fluid recirculation bore 139 and back to the source of coating material (not shown) where this process repeats.

In order to retract the plunger 38 to the open position and permit the flow of coating material into and through the discharge outlet 49, the valve 123 is operated to its open position as previously described and pressurized air is allowed to flow through the valve 123, through the connecting bore 132 into the transfer bore 76 and finally into the air cavity 63, pressurizing the air cavity on the lower side of the air piston 66. The pressurized air acts against the piston 66, applying an upward force on the plunger 38. When the air pressure has risen enough to first overcome the preload and then compress the springs 105, the piston 66 and therefore the plunger 38 is forced upward so that the tapered lower end 45 of the plunger 38 disengages from the seat 47, allowing coating material to flow through the discharge outlet 49. As the piston 66 moves up, air located in that portion of the air cavity 63 above the piston flows out of vent 84.

The plunger 38 is returned to its closed position by activating the valve 123 to its exhaust position, as previously described, which discontinues the flow of air to the air cavity 63 and allows the pressurized air in the air cavity 63 to flow back into the valve 123 through the transfer bore 76 and the connecting bore 132 and exhaust out of the valve 123 to the atmosphere through the exhaust bore 136. By allowing the pressurized air in the air cavity 63 to exhaust, the air pressure drops until the force exerted by the springs 105 is able to actuate the plunger 38 back down into its closed position, thereby stopping the flow of coating material through the discharge outlet 49. As the piston 66 moves down air flows into that portion of the air cavity 63 above the piston 66 through vent 84.

Reducing the response time permits smaller areas on a target substrate to be coated or skipped. To a significant extent, the response time is a function of the rate at which the air pressure against the piston 66 rises and drops and, to a lesser extent, how fast the valve 123 opens and closes. The volume of air between the valve 123 and the air cavity 63 must be pressurized before the plunger 38 can be moved to the open position and depressurized or vented before the plunger 38 can be closed. By mounting the valve 123 so that it is carried by the dispenser body 12, this volume of air can be minimized. With a smaller volume of air to be pressurized or vented, the reaction time between activation of the valve 123 and pressurizing or venting of the air cavity 63 is reduced, thus reducing the response time. With respect to plunger speed, the response time decreases as the speed of the plunger 38 in moving to the open and closed position increases.

The plunger speed is a function of the rate at which the air pressure against the bottom side of the piston 66 in the air cavity 63 rises and exhausts, and the closing force exerted by the springs 105. Generally, if the rate at which the air pressure against the piston 66 in the air cavity 63 rises and exhausts is increased, with the spring rate of the springs 105 remaining constant, the speed of the plunger 38 will increase. Therefore, moving the valve 123 proximate to the dispenser body 12, as described above, results in the plunger speed increasing.

The response time is an important factor in applying a sharply defined, intermittent pattern of coating material on a target substrate. However, as previously noted, merely increasing the speed of the plunger to reduce response time can lead to unwanted hammering. Therefore, another aspect of this invention is the concept of obtaining controlled movement of the plunger 38 between an open and closed position, i.e., rapid enough to produce the desired intermittent pattern without tapering or drooling, but not so fast as to create hammering. Generally, a much higher spring rate is utilized in this invention than has been employed in other dispenser designs. For example, other dispensers have typically employed a single coil spring having a spring rate of about 50 pounds per inch. It was discovered that using such a spring rate with the improved plunger opening structure described above increased the likelihood that hammering would occur, because this low spring rate allowed the plunger to move too fast. By increasing the spring rate to a level on the order of 150 to 300 pounds per inch, a controlled response time is obtained which reduces or eliminates hammering without tapering or drooling.

In an additional aspect of this invention, it is recognized that the same dispenser 10 is often used with a variety of coating materials. It has been found that hammering, tapering and/or drooling can be dependent upon the type of coating material being used, and especially the fluid viscosity of such materials. The coating material is pressurized to control its flow rate through the dispenser 10 and out the discharge outlet 49. If the flow rate of the coating material is changed, due to a change in fluid viscosity, for example, a commensurate change in plunger speed may be required to avoid hammering, tapering or drooling. It has been found that in order to apply the desired "leaf-shaped" pattern to a circuit board through an airless nozzle as disclosed in the Shimada Pat. Nos. 4,753,819 and 4,880,663, higher viscosity coating material must be transmitted through the dispenser 10 to its discharge outlet 49 at a faster velocity and flow rate than lower viscosity coating materials. As a result, the plunger speed must be increased to account for such increase in velocity and flow rate of the coating material.

As previously noted, plunger speed can be easily and reliably controlled by varying the spring rate exerted by springs 105. While a single spring having the appropriate spring rate could be used with the dispenser 10 of this invention, and the spring replaced when a different spring rate is needed, it is preferable to use multiple springs in order to more easily and conveniently control the change in spring rate, and thus the change in plunger speed. It is even more preferable to use a plurality of stacked disc springs 105 because they are easily stackable to varying spring rates and for a given spring rate are generally smaller than a coil spring. The dispenser 10 of this invention has been made to allow these stacked springs 105 to be easily accessed and changed. Thus, the spring rate of the same dispenser 10 can be easily tuned to compensate for changes in coating material and other variables affecting the plunger speed.

One example of a dispenser 10 according to this invention, operated as described above, is given below:

EXAMPLE

| ELEMENT | DIMENSIONS/ OPER. PARAMETERS |
| --- | --- |
| Transfer bore 76 Diameter | 0.060 inches |
| Transfer Bore 76 Length | 1.032 inches |
| Connecting Bore 132 Diameter | 0.060 inches |
| Connecting Bore 132 Length | 1.013 inches |
| Exhaust Bore 136 Diameter (closest to the valve 123) | 0.060 inches |
| Exhaust Bore 136 Length (closest to the valve 123) | 0.250 inches |
| Exhaust Bore 136 Diameter (closest to atmosphere) | 0.125 inches |
| Exhaust Bore 136 Length (closest to atmosphere) | 0.875 inches |
| Vent 84 Diameter | 0.060 inches |
| Vent 84 Length | 0.165 inches |
| Coating Material Pressure | 30 psi |
| Coating Material Viscosity | 30–40 cps |
| Spring Rate of Springs 105 | 225 pounds per inch |
| Air Pressure | 80–85 psi |

All of the above air passageway dimensions have tolerances of +0.002 to −0.003 inches for the diameters, and ±0.010 inches for the lengths. The total volume of such air passageways between the valve 123 and air cavity 63, i.e., connecting bore 132 and transfer bore 76, is therefore about 0.05 cubic inches compared with an estimated 2.06 cubic inches which is typical for prior dispenser systems employing a valve located in a remote position from the dispenser.

Operating under the above-described parameters, the dispenser 10 of this invention is capable of response times in the range of 0.010 and 0.012 seconds, ±0.002 seconds, for starting and stopping the deposition of the coating material, respectively, while still eliminating or at least significantly reducing hammering, tapering and drooling. Previous dispensers manufactured by the assignee of this invention typically had response times in the range of 0.035 – 0.040 seconds and 0.050 – 0.060 seconds for starting and stopping, respectively, with hammering, tapering and drooling being at best an intermittent problem and at worst a continuous problem. With this decrease in the response time, the dispenser 10 of this invention is capable of coating or skipping areas on a target substrate as narrow as about 0.25 inches. Previous dispensers, having the longer response times, were only able to coat or skip areas as narrow as approximately 1.25 inches.

As noted above, the dispenser 10 of this invention can be "tuned" or adjusted to account for changes in the viscosity of the coating material or other variables such as manufacturing tolerances. For example, when a change in the viscosity of the coating material requires an increase in the flow rate of the coating material through the dispenser 10 to its discharge outlet 49, the spring rate must be decreased in order to decrease the time it takes to move the plunger 38 to the opened and closed positions (i.e., to increase the plunger speed), to avoid tapering or drooling. With the present dispenser example, and assuming the force exerted by the pressurized air delivered to the bottom side of the plunger piston 72 remains unchanged, an increase in viscosity to the range of 50–60 centipoise would require a change in spring rate to about 150 pounds per inch. On the other hand, when the change in the viscosity of the coating material requires a decrease in the flow rate of the coating material, the spring rate must be increased in order to slow down the plunger speed to avoid hammering. With the above dispenser example, a decrease in viscosity to the range of 10–20 centipoise requires an increase in the spring rate to about 300 pounds per inch. As mentioned above, it has been found that the higher viscosity material must be transmitted through the dispenser at a higher velocity and flow rate to get a coating pattern on the target substrate that is equivalent to the pattern obtained with a lower viscosity material. In contrast, the lower viscosity material is moved more slowly through the dispenser to get a coating pattern that is equivalent to that obtained with a higher viscosity material. For a given coating material, with a substantially constant viscosity, if the spring rate is too low, the plunger will move too fast and hammering will occur. However, if the spring rate is too high, the plunger will move too slow and tapering and drooling will occur. The spring rate is thus adjusted or "tuned" by varying the number of disc springs 105 stacked atop one another to obtain the desired speed of plunger movement.

The coating material is typically pressurized in the range of 15–60 psi, with higher pressures being used to move the higher viscosity coating materials, and lower pressures being used to move lower viscosity materials. The pressure applied to the coating material and the material's viscosity generally have a minor affect on the plunger speed, especially compared to changes in the spring rate.

While this invention has been described with reference to a preferred embodiment, it will be understood by those skilled in the art that various changes may be made and equivalence may be substituted for elements thereof without departing from the scope of the invention. In addition, many modifications could be made to adapt a particular situation or material to the teachings of the invention without departing from the essential scope thereof.

Therefore, it is intended that the invention not be limited to the particular embodiment disclosed as the best mode contemplated for carrying out this invention, but that the invention will include all embodiments falling within the scope of the appended claims.

What is claimed is:

1. A dispensing apparatus for applying a coating material to a substrate, comprising:
   a dispenser body formed with an air cavity, a spring cavity, a fluid bore having an inlet for receiving coating material and a discharge outlet, and a transfer bore for selectively communicating a source of pressurized air with said air cavity;
   a plunger movable within said fluid bore between an open and closed position relative to said discharge outlet;
   a piston connected to said plunger in position within said air cavity, said piston separating said air cavity into a first portion and a second portion, said transfer bore being connected to said first portion, said dispenser body being formed with a vent which connects said second portion to atmosphere;
   plunger opening means, carried by said dispenser body, for directing a flow of pressurized air through said transfer bore into said air cavity and against said piston to move said plunger to said open position; and
   plunger return means for returning said plunger to said closed position, said return means including a plurality of spring means stackable atop said piston within said spring cavity, said spring means being configured and oriented such that the number of said spring means stacked within said spring cavity is changeable to provide a selected biasing force against said plunger.

2. The apparatus of claim 1 in which said plunger opening means comprises:
   a manifold formed with a connecting bore, said manifold being mounted to said dispenser body so that said connecting bore communicates with said transfer bore; and
   a valve mounted to said manifold in communication with said connecting bore, said valve being adapted to selectively connect a source of pressurized air to said connecting bore.

3. The apparatus of claim 2, said valve being a three-way solenoid valve.

4. The apparatus of claim 2, said valve being a four-way solenoid valve having two outlet ports, one of said outlet ports being blocked off.

5. The apparatus of claim 1 wherein each of said spring means is a disk spring.

6. The apparatus of claim 5 wherein each of said disk springs is generally bowl-shaped with a concave side and a convex side, said springs being grouped in parallel pairs wherein the convex side of one spring of each of said parallel pairs contacts the concave side of the other spring of said parallel pair, each of said parallel pairs thereby having its own convex side and concave side, said parallel pairs being stacked one on top of another in series with the concave side of one pair facing the concave side of an adjacent pair and the convex sides of said one pair facing the convex side of another, adjacent pair.

7. A dispensing apparatus for applying a coating material to a substrate, comprising:
   a dispenser body formed with an air cavity, and a fluid bore having an inlet for receiving coating material and a discharge outlet, said dispenser body being formed with a transfer bore for selectively communicating a source of pressurized air with said air cavity;
   a plunger movable within said fluid bore between an open and closed position relative to said discharge outlet;
   a piston connected to said plunger in position within said air cavity, said piston separating said air cavity into a first portion and a second portion, said transfer bore being connected to said first portion, said dispenser body being formed with a vent which connects said second portion to atmosphere;
   plunger opening means, carried by said dispenser body, for controlling a flow of pressurized air through said transfer bore, into said air cavity and against said piston to move said plunger to the open position; and
   plunger return means for constantly biasing said plunger to said closed position, said plunger return means including at least one spring means configured and oriented to have a spring rate of about 150 pounds per inch or greater.

8. The apparatus of claim 7 in which said plunger opening means comprises:
   a manifold formed with a connected bore, said manifold being mounted to said dispenser body so that said connecting bore communicates with said transfer bore; and
   a valve mounted to said manifold in communication with said connecting bore, said valve being adapted to selectively connect a source of pressurized air to said connecting bore.

9. The apparatus of claim 7 wherein said plunger return means includes a plurality of spring means staked atop one another in position to engage said piston.

* * * * *